United States Patent
Dai

(10) Patent No.: US 9,581,873 B2
(45) Date of Patent: Feb. 28, 2017

(54) GATE DRIVER ON ARRAY CIRCUIT REPAIR METHOD

(71) Applicant: Shenzhen China Star Optoelectronics Technology Co., Ltd., Shenzhen (CN)

(72) Inventor: Chao Dai, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/761,306

(22) PCT Filed: Jun. 23, 2015

(86) PCT No.: PCT/CN2015/082008
§ 371 (c)(1),
(2) Date: Jul. 16, 2015

(87) PCT Pub. No.: WO2016/173105
PCT Pub. Date: Nov. 3, 2016

(65) Prior Publication Data
US 2016/0313620 A1    Oct. 27, 2016

(30) Foreign Application Priority Data

Apr. 27, 2015  (CN) .......................... 2015 1 0204902

(51) Int. Cl.
*H01L 21/768*  (2006.01)
*G02F 1/1362*  (2006.01)
(Continued)

(52) U.S. Cl.
CPC ........ *G02F 1/136259* (2013.01); *H01L 22/14* (2013.01); *H01L 27/124* (2013.01);
(Continued)

(58) Field of Classification Search
CPC .............. H01L 21/76892; H01L 22/22; H01L 27/1259; G02F 1/136259; G02F 2001/136263
(Continued)

(56) References Cited

U.S. PATENT DOCUMENTS

2015/0346904 A1* 12/2015 Long ..................... G06F 3/0412
345/174

\* cited by examiner

*Primary Examiner* — Thanh V Pham
(74) *Attorney, Agent, or Firm* — Leong C. Lei

(57) ABSTRACT

In the GOA circuit repair method provided by the present invention, the repair signal (Repair signal) is received by the GOA unit circuits of the Nth stage and the N+1th stage via the repair signal line (L1) respectively to be the output signal of the GOA unit circuit of the Nth stage, and the scan control signal of the GOA unit circuit of the N+1th stage to achieve the repair to the GOA unit circuit of the Nth stage; or the start signal (STV) is received by the GOA unit circuits of the N+1th stage and the N+2th stage via the start signal line (L5) respectively to be the output signal of the GOA unit circuit of the N+1th stage, and the scan control signal of the GOA unit circuit of the N+2th stage to achieve the repair to the GOA unit circuit of the N+1th stage, and meanwhile, the repair signal (Repair signal) is received by the GOA unit circuits of the N+2th stage and the N+3th stage via the repair signal line (L1) respectively to be the output signal of the GOA unit circuit of the N+2th stage, and the scan control signal of the GOA unit circuit of the N+3th stage to achieve the repair to the GOA unit circuit of the N+2th stage, it is capable of reducing the repair difficulty of the GOA circuit to raise the yield of the GOA production and to decrease the production cost.

12 Claims, 12 Drawing Sheets

(51) Int. Cl.
    *H01L 27/12* (2006.01)
    *H01L 21/66* (2006.01)
(52) U.S. Cl.
    CPC .................... *H01L 27/1259* (2013.01); *G02F 2001/136263* (2013.01)
(58) Field of Classification Search
    USPC .......................................................... 438/4
    See application file for complete search history.

GATE DRIVER ON ARRAY CIRCUIT REPAIR METHOD

FIELD OF THE INVENTION

The present invention relates to a display technology field, and more particularly to a GOA circuit repair method.

BACKGROUND OF THE INVENTION

The Liquid Crystal Display (LCD) possesses advantages of thin body, power saving and no radiation to be widely used in many application scope, such as LCD TV, mobile phone, personal digital assistant (PDA), digital camera, notebook, laptop, and dominates the flat panel display field.

Most of the liquid crystal displays on the present market are backlight type liquid crystal displays, which comprise a liquid crystal display panel and a backlight module. The working principle of the liquid crystal display panel is that the Liquid Crystal is injected between the Thin Film Transistor Array Substrate (TFT array substrate) and the Color Filter (CF). The light of backlight module is refracted to generate images by applying driving voltages to the two substrates for controlling the rotations of the liquid crystal molecules.

In the active liquid crystal display, each pixel is electrically coupled to a thin film transistor (TFT), and the gate of the thin film transistor is coupled to a level scan line, and the drain is coupled to a vertical data line, and the source is coupled to the pixel electrode. The enough voltage is applied to the level scan line, and all the TFTs electrically coupled to the horizontal scan line are activated. Thus, the signal voltage on the data line can be written into the pixel to control the transmittances of different liquid crystals to achieve the effect of controlling colors and brightness. The driving of the level scan line in the present active liquid crystal display is mainly accomplished by the external Integrated Circuit (IC). The external IC can control the charge and discharge stage by stage of the level scan lines of respective stages. The GOA (Gate Driver on Array) technology, i.e. the array substrate row driving technology can utilize the array manufacture process of the liquid crystal display panel to manufacture the gate driving circuit on the TFT array substrate for realizing the driving way of scanning the gates row by row. The GOA technology can reduce the bonding procedure of the external IC and has potential to raise the productivity and lower the production cost. Meanwhile, it can make the liquid crystal display panel more suitable to the narrow frame or non frame design of display products.

The most main objective of applying the GOA technology to the liquid crystal display is to decrease the cost. However, there is higher demand to the manufacture process. In the process of manufacturing the GOA circuit, the damage can easily happen and the GOA circuit is difficult to repair after the damage happened. It significantly influences the yield of the GOA production and loses the original intention of reducing the production cost by utilizing the GOA technology.

SUMMARY OF THE INVENTION

An objective of the present invention is to provide a GOA circuit repair method, capable of reducing the repair difficulty of the GOA circuit to raise the yield of the GOA production and to decrease the production cost.

For realizing the aforesaid objective, the present invention provides GOA circuit repair method, and first providing a plurality of GOA unit circuit which are cascade connected, a repair signal and a repair signal line electrically coupled to the repair signal;

wherein the GOA unit circuit of every stage comprises a pull-up controlling module, a pull-up module, a transmission module, a first pull-down module, a bootstrap capacitor and a pull-down holding module;

N is set to be a positive integer and in the GOA unit circuit of Nth stage, the pull-up controlling module comprises an eleventh thin film transistor, and a gate of the eleventh thin film transistor receives a scan control signal of the GOA unit circuit of the former N−1th stage, and a source is electrically coupled to a constant high voltage level, and a drain is electrically coupled to a first node; the transmission module outputs a scan control signal of the GOA unit circuit of the latter N−1th stage; the pull-up module outputs a scan signal; the gate of the eleventh thin film transistor is electrically coupled to a gate lead, and the scan signal is outputted via the scan signal output line;

then, performing detection to the GOA circuit, and the two GOA unit circuits of the Nth stage, the N+1th stage are took to be one set, and as that the GOA unit circuit of the Nth stage is in normal work is detected, the gate lead of the eleventh thin film transistor and the repair signal line in the GOA unit circuit of the Nth stage are insulation overlapping, and the scan signal output line and the repair signal line in the GOA unit circuit of the Nth stage are insulation overlapping; the gate lead of the eleventh thin film transistor and the repair signal line in the GOA unit circuit of the N+1th stage are insulation overlapping, and the scan signal output line and the repair signal line in the GOA unit circuit of the N+1th stage are insulation overlapping;

as that the GOA unit circuit of the Nth stage is broken is detected, cutting the connection between the scan signal output line and the pull-up module in the GOA unit circuit of the Nth stage, and the connection between the gate of the eleventh thin film transistor in the GOA unit circuit of the N+1th stage and the scan control signal of the GOA unit circuit of the N+1th stage by laser, and conducting the scan signal output line and the repair signal line in the GOA unit circuit of the Nth stage, and the gate lead of the eleventh thin film transistor and the repair signal line in the GOA unit circuit of the N+1th stage by laser welding, and thus, the repair signal is received by the GOA unit circuits of the Nth stage, the N+1th stage respectively to be an output signal of the GOA unit circuit of the Nth stage, and the scan control signal of the GOA unit circuit of the N+1th stage.

The insulation overlapping is achieved by positioning an insulation layer between the first, second metal layers.

In the GOA unit circuit of the Nth stage, the pull-up module comprises: a twenty-first thin film transistor, and a gate of the twenty-first thin film transistor is electrically coupled to the first node, and a source is electrically coupled to an Mth clock signal, and a drain is electrically coupled to a second node and outputs the scan signal;

the transmission module comprises: a twenty-second thin film transistor, and a gate of the twenty-second thin film transistor is electrically coupled to the first node, and a source is electrically coupled to the Mth clock signal, and a drain is electrically coupled to the scan control signal of the GOA unit circuit of the N+1th stage;

the first pull-down module comprises: a fortieth thin film transistor, and both a gate and a source of the fortieth thin film transistor are electrically coupled to the first node, and a drain is electrically coupled to the source of a forty-first thin film transistor; a gate of the forty-first thin film transistor is electrically coupled to an M+2th clock signal, and a source is electrically coupled to the drain of the fortieth thin film transistor, and a drain is electrically coupled to the second node;

one end of the bootstrap capacitor is electrically coupled to the first node, and the other end is electrically coupled to the second node;

the pull-down holding module comprises: an inverter, and an input end of the inverter is electrically coupled to the first node, and an output end is electrically coupled to a gate of a thirty-second thin film transistor and a gate of the forty-second thin film transistor; the thirty-second thin film transistor, and a gate of the thirty-second thin film transistor is electrically coupled to the output end of the inverter, and a source is electrically coupled to the drain of the forty-first thin film transistor, and a drain is electrically coupled to a first negative voltage level; the forty-second thin film transistor, and a gate of the forty-second thin film transistor is electrically coupled to the output end of the inverter, and the drain is electrically coupled to the first node, and a source is electrically coupled to a constant low voltage level;

the clock signal comprises four clock signals: a first clock signal, a second clock signal, a third clock signal and a fourth clock signal; as the clock signal is the third clock signal, the M+2th clock signal is the first clock signal, and as the clock signal is the fourth clock signal, the M+2th clock signal is the second clock signal.

The second embodiment of the GOA circuit repair method is that first providing a plurality of GOA unit circuit which are cascade connected, a repair signal and a repair signal line electrically coupled to the repair signal;

wherein the GOA unit circuit of every stage comprises a pull-up controlling module, a pull-up module, a transmission module, a first pull-down module, a bootstrap capacitor and a pull-down holding module;

N is set to be a positive integer and in the GOA unit circuit of Nth stage, the pull-up controlling module comprises an eleventh thin film transistor and a twelfth thin film transistor coupled in parallel, and a gate of the eleventh thin film transistor receives a scan control signal of the GOA unit circuit of the former N−1th stage, and a source is electrically coupled to a constant high voltage level, and a drain is electrically coupled to a first node, and a gate of the twelfth thin film transistor is electrically coupled to a gate lead, and a source is electrically coupled to the constant high voltage level, and a drain is electrically coupled to the first node; the transmission module outputs a scan control signal of the GOA unit circuit of the latter N+1th stage; the pull-up module outputs a scan signal; the scan signal is outputted via the scan signal output line;

then, performing detection to the GOA circuit, and the two GOA unit circuits of the Nth stage, the N+1th stage are took to be one set, and as that the GOA unit circuit of the Nth stage is in normal work is detected, the gate lead of the twelfth thin film transistor and the repair signal line in the GOA unit circuit of the Nth stage are insulation overlapping, and the scan signal output line and the repair signal line in the GOA unit circuit of the Nth stage are insulation overlapping; the gate lead of the twelfth thin film transistor and the repair signal line in the GOA unit circuit of the N+1th stage are insulation overlapping, and the scan signal output line and the repair signal line in the GOA unit circuit of the N+1th stage are insulation overlapping;

as that the GOA unit circuit of the Nth stage is broken is detected, cutting the connection between the scan signal output line and the pull-up module in the GOA unit circuit of the Nth stage, and the connection between the drain of the eleventh thin film transistor and the first node in the GOA unit circuit of the N+1th stage by laser, and conducting the scan signal output line and the repair signal line in the GOA unit circuit of the Nth stage, and the gate lead of the twelfth thin film transistor and the repair signal line in the GOA unit circuit of the N+1th stage by laser welding, and thus, the repair signal is received by the GOA unit circuits of the Nth stage, the N+1th stage respectively to be an output signal of the GOA unit circuit of the Nth stage, and the scan control signal of the GOA unit circuit of the N+1th stage.

Selectably, the GOA unit circuit of the Nth stage further comprises a ninth thin film transistor, and a gate of the ninth thin film transistor is electrically coupled to the constant high voltage level, and a drain is electrically coupled to the scan signal output line, and a source is electrically coupled to a source lead;

performing detection to the GOA circuit, and the two GOA unit circuits of the Nth stage, the N+1th stage are took to be one set, and as that the GOA unit circuit of the Nth stage is in normal work is detected, the source lead of the ninth thin film transistor and the repair signal line in the GOA unit circuit of the Nth stage are insulation overlapping, and the source lead of the ninth thin film transistor and the repair signal line in the GOA unit circuit of the N+1th stage are insulation overlapping;

as that the GOA unit circuit of the Nth stage is broken is detected, connecting the source lead of the ninth thin film transistor and the repair signal line in the GOA unit circuit of the Nth stage by laser welding, and thus, conducting the scan signal output line and the repair signal line.

The insulation overlapping is achieved by positioning an insulation layer between the first, second metal layers.

In the GOA unit circuit of the Nth stage, the pull-up module comprises: a twenty-first thin film transistor, and a gate of the twenty-first thin film transistor is electrically coupled to the first node, and a source is electrically coupled to an Mth clock signal, and a drain is electrically coupled to a second node and outputs the scan signal;

the transmission module comprises: a twenty-second thin film transistor, and a gate of the twenty-second thin film transistor is electrically coupled to the first node, and a source is electrically coupled to the Mth clock signal, and a drain is electrically coupled to the scan control signal of the GOA unit circuit of the N+1th stage;

the first pull-down module comprises: a fortieth thin film transistor, and both a gate and a source of the fortieth thin film transistor are electrically coupled to the first node, and a drain is electrically coupled to the source of a forty-first thin film transistor; a gate of the forty-first thin film transistor is electrically coupled to an M+2th clock signal, and a source is electrically coupled to the drain of the fortieth thin film transistor, and a drain is electrically coupled to the second node;

one end of the bootstrap capacitor is electrically coupled to the first node, and the other end is electrically coupled to the second node;

the pull-down holding module comprises: an inverter, and an input end of the inverter is electrically coupled to the first node, and an output end is electrically coupled to a gate of a thirty-second thin film transistor and a gate of the forty-second thin film transistor; the thirty-second thin film transistor, and a gate of the thirty-second thin film transistor is electrically coupled to the output end of the inverter, and a source is electrically coupled to the drain of the forty-first thin film transistor, and a drain is electrically coupled to a first negative voltage level; the forty-second thin film transistor, and a gate of the forty-second thin film transistor is electrically coupled to the output end of the inverter, and the drain is electrically coupled to the first node, and a source is electrically coupled to a constant low voltage level;

the clock signal comprises four clock signals: a first clock signal, a second clock signal, a third clock signal and a fourth clock signal; as the clock signal is the third clock signal, the M+2th clock signal is the first clock signal, and as the clock signal is the fourth clock signal, the M+2th clock signal is the second clock signal.

The third embodiment of the GOA circuit repair method is that first providing a plurality of GOA unit circuit which are cascade connected, a repair signal, a repair signal line electrically coupled to the repair signal, a start signal and a start signal line electrically coupled to the start signal;

wherein the GOA unit circuit of every stage comprises a pull-up controlling module, a pull-up module, a transmission module, a first pull-down module, a bootstrap capacitor and a pull-down holding module;

N is set to be a positive integer and in the GOA unit circuit of Nth stage, the pull-up controlling module comprises an eleventh thin film transistor and a twelfth thin film transistor coupled in parallel, and a gate of the eleventh thin film transistor receives a scan control signal of the GOA unit circuit of the former N−1th stage, and a source is electrically coupled to a constant high voltage level, and a drain is electrically coupled to a first node, and a gate of the twelfth thin film transistor is electrically coupled to a gate lead, and a source is electrically coupled to the constant high voltage level, and a drain is electrically coupled to the first node; the transmission module outputs a scan control signal of the GOA unit circuit of the latter N+1th stage; the pull-up module outputs a scan signal; the scan signal is outputted via the scan signal output line;

then, performing detection to the GOA circuit, and the four GOA unit circuits of the Nth stage, the N+1th stage, the N+2th stage and the N+3th stage are took to be one set, and as that the GOA unit circuits of the N+1th stage and the N+2th stage are in normal work is detected, the gate leads of the respective twelfth thin film transistors of the Nth stage, the N+1th stage, the N+2th stage and the N+3th stage are respectively insulation overlapping with the repair signal lines and the start signal lines, and the scan signal output line is respectively insulation overlapping with the repair signal line and the start signal line;

as that the GOA unit circuits of the N+1th stage and the N+2th stage are broken is detected, cutting the connection between the scan signal output line and the pull-up module in the GOA unit circuit of the N+1th stage, the connection between the drain of the eleventh thin film transistor and the first node in the GOA unit circuit of the N+2th stage, the connection between the scan signal output line and the pull-up module in the GOA unit circuit of the N+2th stage, and the connection between the drain of the eleventh thin film transistor and the first node in the GOA unit circuit of the N+3th stage by laser, and conducting the scan signal output line and the start signal line in the GOA unit circuit of the N+1th stage, and the gate lead of the twelfth thin film transistor and the start signal line in the GOA unit circuit of the N+2th stage, the scan signal output line and the repair signal line in the GOA unit circuit of the N+2th stage, and the gate lead of the twelfth thin film transistor and the repair signal line in the GOA unit circuit of the N+3th stage by laser welding, and thus, the start signal is received by the GOA unit circuits of the N+1th stage and the N+2th stage, respectively to be an output signal of the GOA unit circuit of the N+1th stage, and the scan control signal of the GOA unit circuit of the N+2th stage, and the repair signal is received by the GOA unit circuits of the N+2th stage and the N+3th stage, respectively to be an output signal of the GOA unit circuit of the N+2th stage, and the scan control signal of the GOA unit circuit of the N+3th stage.

The insulation overlapping is achieved by positioning an insulation layer between the first, second metal layers.

In the GOA unit circuit of the Nth stage, the pull-up module comprises: a twenty-first thin film transistor, and a gate of the twenty-first thin film transistor is electrically coupled to the first node, and a source is electrically coupled to an Mth clock signal, and a drain is electrically coupled to a second node and outputs the scan signal;

the transmission module comprises: a twenty-second thin film transistor, and a gate of the twenty-second thin film transistor is electrically coupled to the first node, and a source is electrically coupled to the Mth clock signal, and a drain is electrically coupled to the scan control signal of the GOA unit circuit of the N+1th stage;

the first pull-down module comprises: a fortieth thin film transistor, and both a gate and a source of the fortieth thin film transistor are electrically coupled to the first node, and a drain is electrically coupled to the source of a forty-first thin film transistor; a gate of the forty-first thin film transistor is electrically coupled to an M+2th clock signal, and a source is electrically coupled to the drain of the fortieth thin film transistor, and a drain is electrically coupled to the second node;

one end of the bootstrap capacitor is electrically coupled to the first node, and the other end is electrically coupled to the second node;

the pull-down holding module comprises: an inverter, and an input end of the inverter is electrically coupled to the first node, and an output end is electrically coupled to a gate of a thirty-second thin film transistor and a gate of the forty-second thin film transistor; the thirty-second thin film transistor, and a gate of the thirty-second thin film transistor is electrically coupled to the output end of the inverter, and a source is electrically coupled to the drain of the forty-first thin film transistor, and a drain is electrically coupled to a first negative voltage level; the forty-second thin film transistor, and a gate of the forty-second thin film transistor is electrically coupled to the output end of the inverter, and the drain is electrically coupled to the first node, and a source is electrically coupled to a constant low voltage level;

the clock signal comprises four clock signals: a first clock signal, a second clock signal, a third clock signal and a fourth clock signal; as the clock signal is the third clock signal, the M+2th clock signal is the first clock signal, and as the clock signal is the fourth clock signal, the M+2th clock signal is the second clock signal.

The benefits of the present invention are: in the GOA circuit repair method provided by the present invention, the repair signal is received by the GOA unit circuits of the Nth stage and the N+1th stage via the repair signal line respectively to be the output signal of the GOA unit circuit of the Nth stage, and the scan control signal of the GOA unit circuit of the N+1th stage to achieve the repair to the GOA unit circuit of the Nth stage; or the start signal is received by the GOA unit circuits of the N+1th stage and the N+2th stage via the start signal line respectively to be the output signal of the GOA unit circuit of the N+1th stage, and the scan control signal of the GOA unit circuit of the N+2th stage to achieve the repair to the GOA unit circuit of the N+1th stage, and meanwhile, the repair signal is received by the GOA unit circuits of the N+2th stage and the N+3th stage via the repair signal line respectively to be the output signal of the GOA unit circuit of the N+2th stage, and the scan control signal of the GOA unit circuit of the N+3th stage to achieve the repair to the GOA unit circuit of the N+2th stage, it is capable of reducing the repair difficulty of the GOA circuit to raise the yield of the GOA production and to decrease the production cost.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

Figure 1:
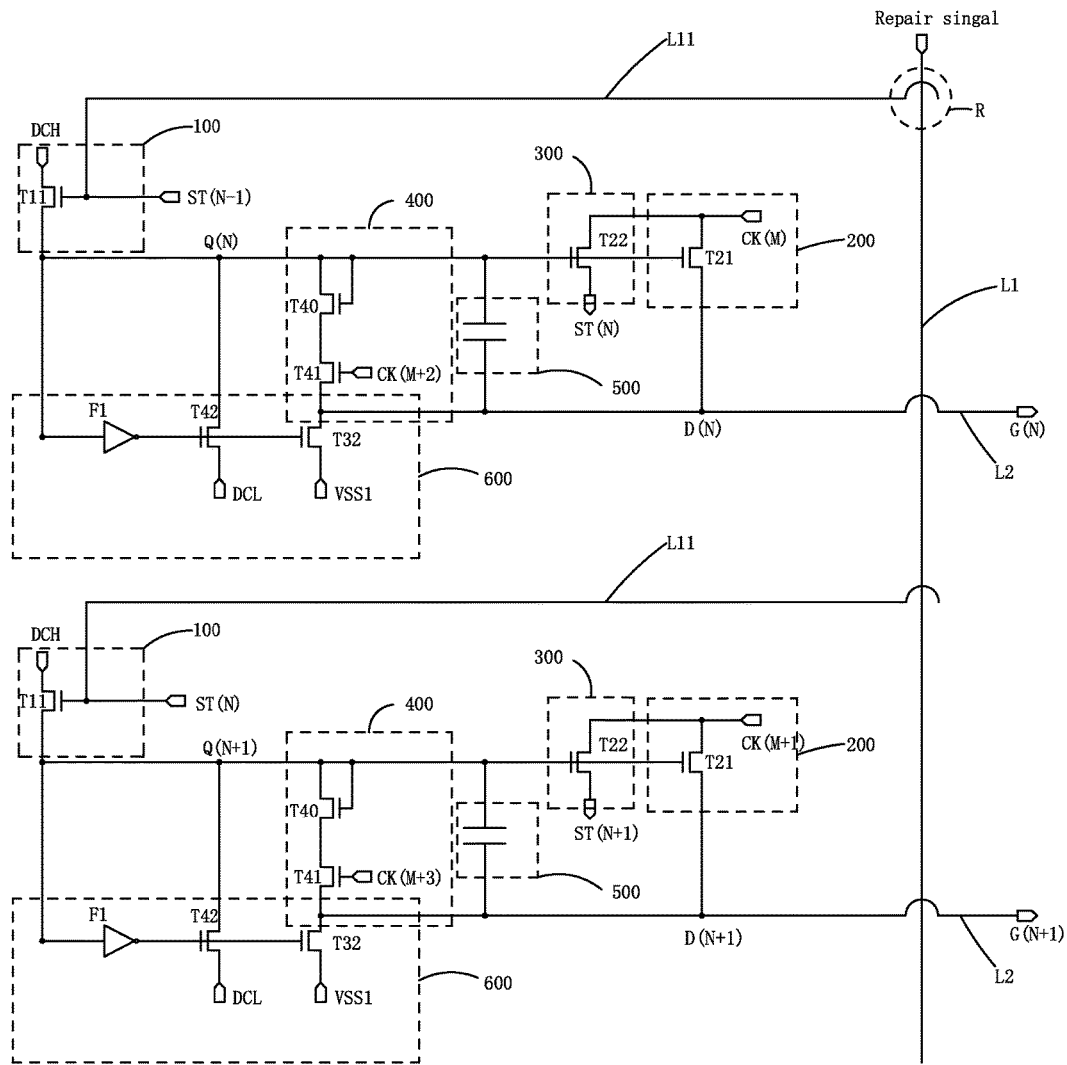
FIG. 1 is a circuit diagram of the first embodiment according to the GOA circuit repair method of the present invention before repair.

For better explaining the technical solution and the effect of the present invention, the present invention will be further described in detail with the accompanying drawings and the specific embodiments.

The present invention provides a GOA circuit repair method. Please refer to FIG. 1 to FIG. 4 and FIG. 9 showing the first embodiment of the GOA circuit repair method according to the present invention:

first providing a plurality of GOA unit circuit which are cascade connected, a repair signal and a repair signal line L1 electrically coupled to the repair signal;

wherein the GOA unit circuit of every stage comprises a pull-up controlling module 100, a pull-up module 200, a transmission module 300, a first pull-down module 400, a bootstrap capacitor 500 and a pull-down holding module 600;

N is set to be a positive integer and in the GOA unit circuit of Nth stage, the pull-up controlling module 100 comprises an eleventh thin film transistor T11, and a gate of the eleventh thin film transistor T11 receives a scan control signal ST(N−1) of the GOA unit circuit of the former N−1th stage, and a source is electrically coupled to a constant high voltage level DCH, and a drain is electrically coupled to a first node Q(N); the transmission module 300 outputs a scan control signal ST(N) of the GOA unit circuit of the latter N+1th stage; the pull-up module 200 outputs a scan signal G(N); the gate of the eleventh thin film transistor T11 is electrically coupled to a gate lead L11, and the scan signal G(N) is outputted via the scan signal output line L2.

Figure 2:
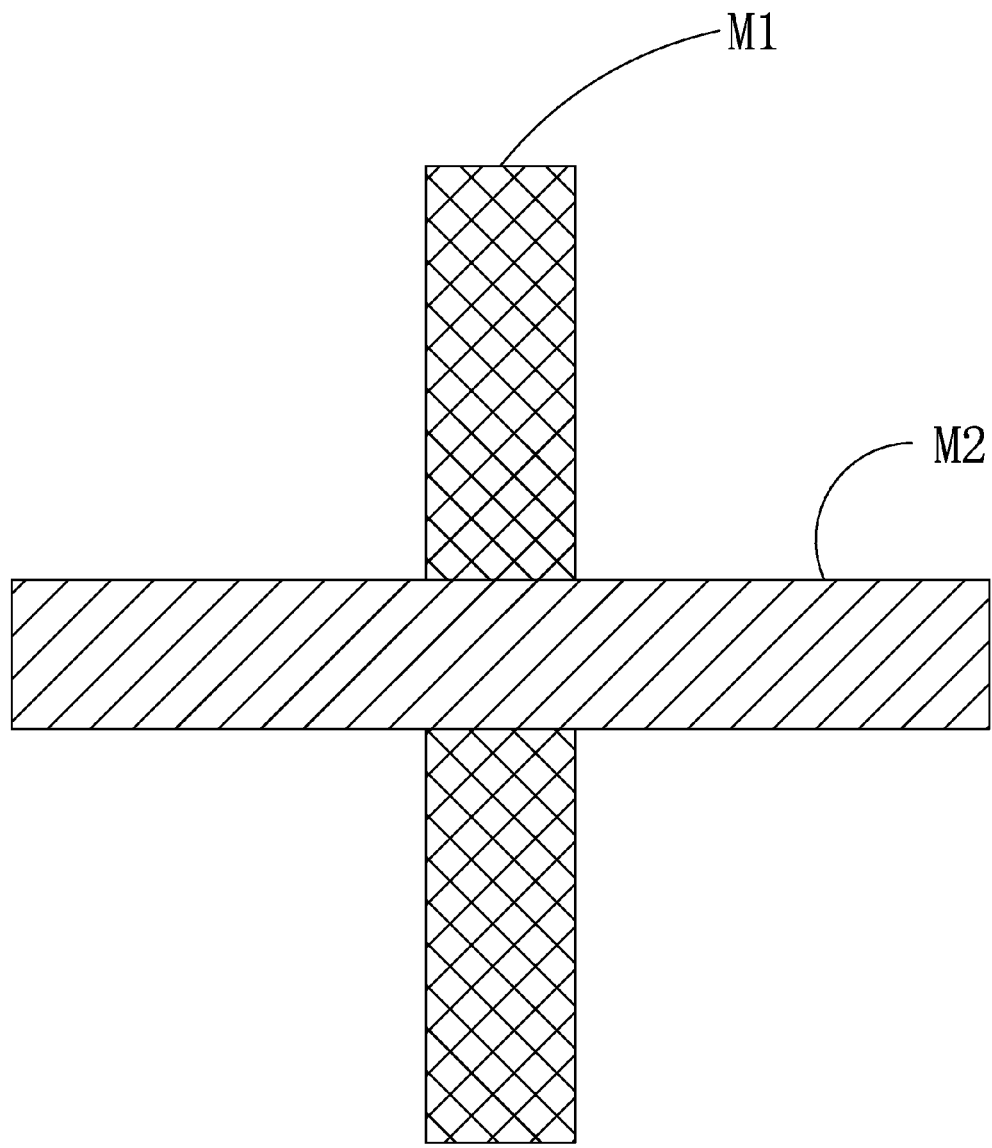
FIG. 2 is a plane structure diagram corresponding to the R location in FIG. 1.
Figure 3:
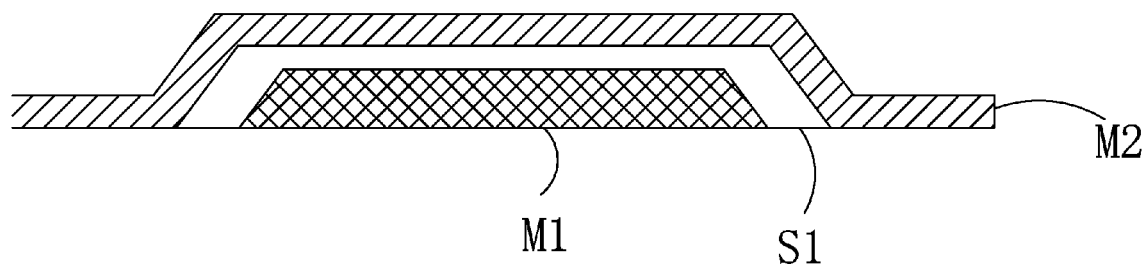
FIG. 3 is a sectional structure diagram corresponding to the R location in FIG. 1.
Figure 4:
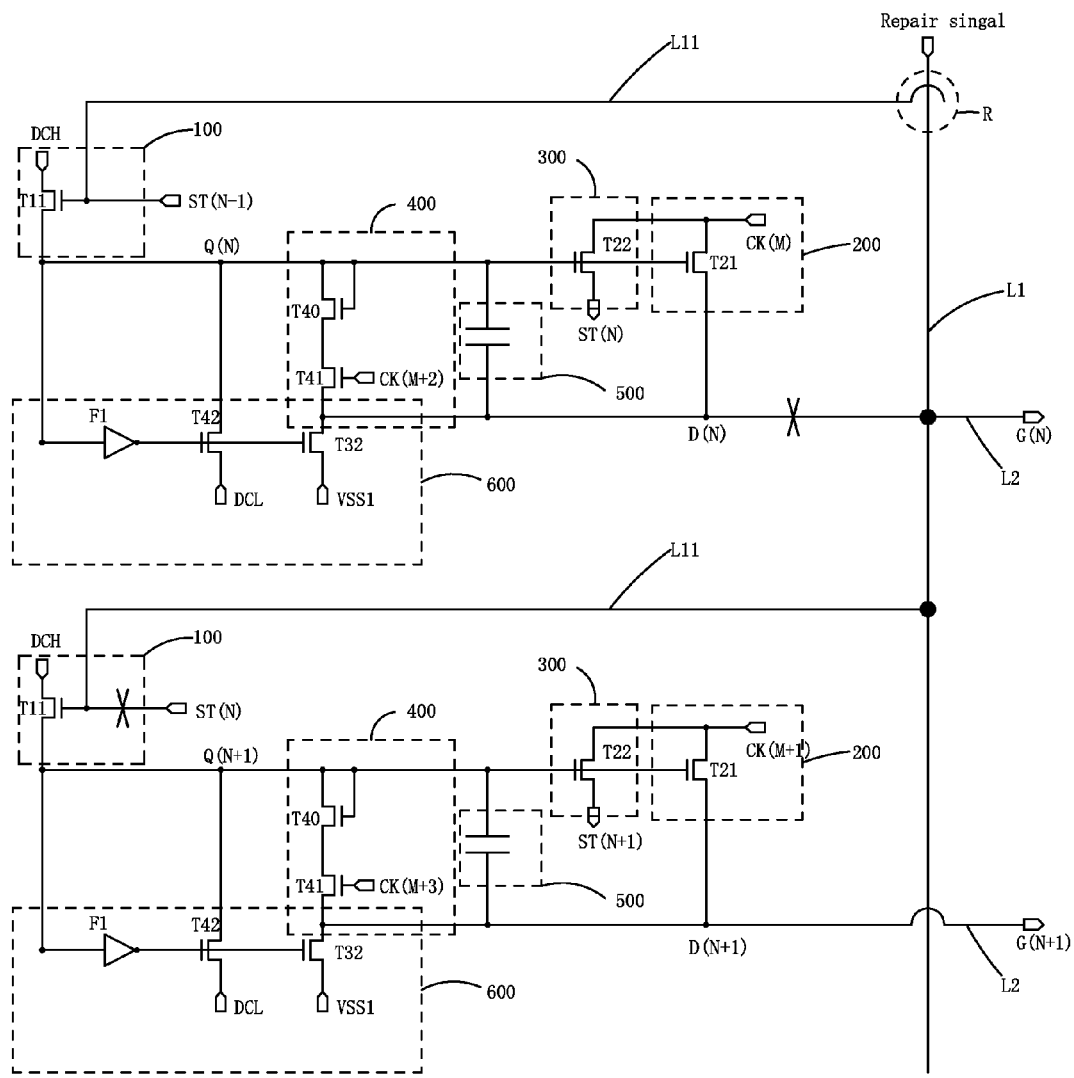
FIG. 4 is a circuit diagram of the first embodiment according to the GOA circuit repair method of the present invention after repair.

Then, performing detection to the GOA circuit, and the two GOA unit circuits of the Nth stage, the N+1th stage are took to be one set, and as that the GOA unit circuit of the Nth stage is in normal work is detected, the gate lead L11 of the eleventh thin film transistor T11 and the repair signal line L1 in the GOA unit circuit of the Nth stage are insulation overlapping, and the scan signal output line L2 and the repair signal line L1 in the GOA unit circuit of the Nth stage are insulation overlapping; the gate lead L11 of the eleventh thin film transistor T11 and the repair signal line L1 in the GOA unit circuit of the N+1th stage are insulation overlapping, and the scan signal output line L2 and the repair signal line L1 in the GOA unit circuit of the N+1th stage are insulation overlapping. Specifically, as shown in FIG. 2, FIG. 3, the insulation overlapping is achieved by positioning an insulation layer S1 between the first, second metal layers M1, M2. The insulation overlapping in R shown in FIG. 1, FIG. 4 can be illustrated. The first metal layer M1 can be employed to form the repair signal line L1, and the second metal layer M2 can be employed to form the gate lead L11. The two can be insulated with the insulation layer S1 manufactured with Silicon Nitride or Silicon Oxide.

As that the GOA unit circuit of the Nth stage is broken is detected, cutting the connection between the scan signal output line L2 and the pull-up module 200 in the GOA unit circuit of the Nth stage, and the connection between the gate of the eleventh thin film transistor T11 in the GOA unit circuit of the N+1th stage and the scan control signal ST(N) of the GOA unit circuit of the N+1th stage by laser (a cross is used to indicate in FIG. 4), and conducting the scan signal output line L2 and the repair signal line L1 in the GOA unit circuit of the Nth stage, and the gate lead L11 of the eleventh thin film transistor T11 and the repair signal line L1 in the GOA unit circuit of the N+1th stage by laser welding (a filled circle is used to indicate in FIG. 4), and thus, the repair signal is received by the GOA unit circuits of the Nth stage, the N+1th stage respectively to be an output signal of the GOA unit circuit of the Nth stage, and the scan control signal of the GOA unit circuit of the N+1th stage to accomplish the repair to the GOA unit circuit of the Nth stage and to make the GOA unit circuits of the Nth stage, the N+1th stage remain the normal function.

Figure 9:
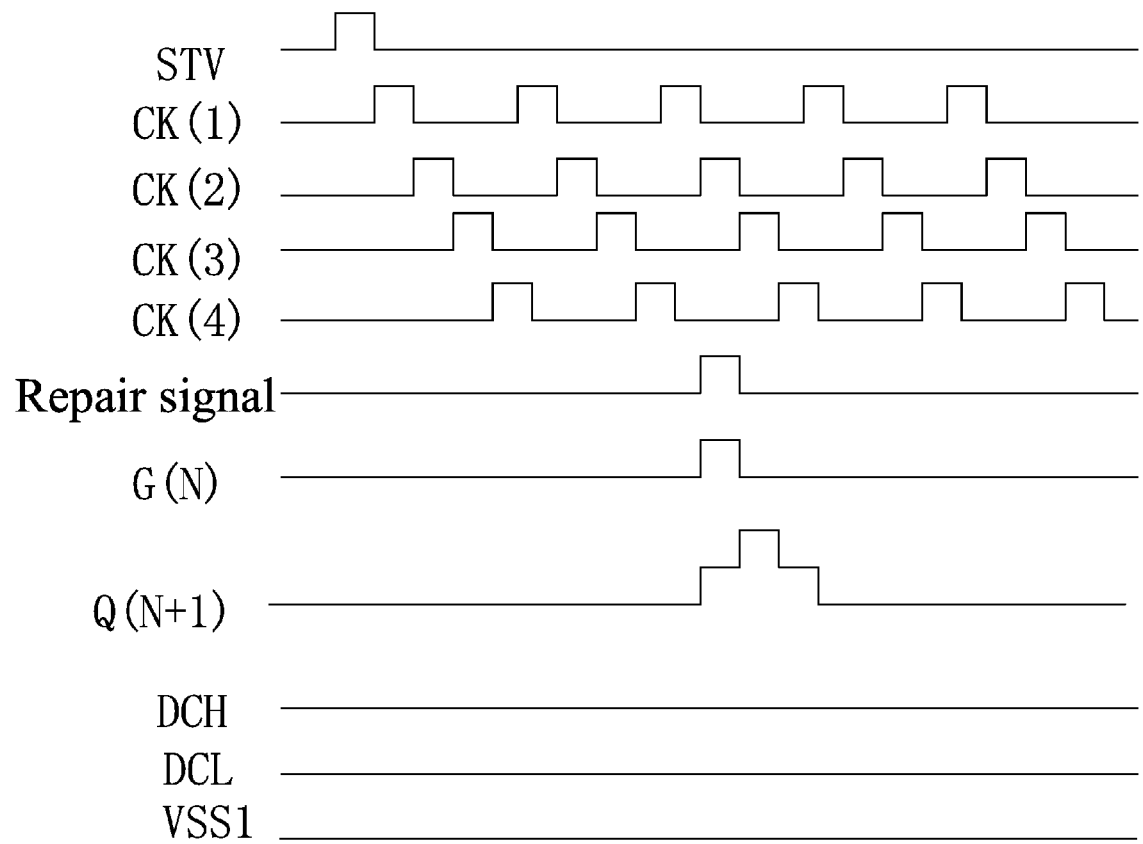
FIG. 9 is a sequence diagram corresponding to the first, second and third embodiments according to the GOA circuit repair method of the present invention.

FIG. 9 is a sequence diagram corresponding to the first embodiment according to the GOA circuit repair method of the present invention. The clock signal CK(M) comprises four clock signals: a first clock signal CK(1), a second clock signal CK(2), a third clock signal CK(3) and a fourth clock signal CK(4); as the clock signal CK(M) is the third clock signal (CK(3)), the M+2th clock signal CK(M+2) is the first clock signal CK(1), and as the clock signal CK(M) is the fourth clock signal CK(4), the M+2th clock signal CK(M+2) is the second clock signal CK(2); STV is the circuit start signal having only one pulse; the repair signal generates the output signal G(N) of the GOA unit circuit of the Nth stage.

Furthermore, in the GOA unit circuit of the Nth stage, the pull-up module 200 comprises: a twenty-first thin film transistor T21, and a gate of the twenty-first thin film transistor T21 is electrically coupled to the first node Q(N), and a source is electrically coupled to an Mth clock signal CK(M), and a drain is electrically coupled to a second node D(N) and outputs a scan driving signal G(N);

the pull-down module 300 comprises: a twenty-second thin film transistor T22, and a gate of the twenty-second thin film transistor T22 is electrically coupled to the first node Q(N), and a source is electrically coupled to the Mth clock signal CK(M), and a drain outputs a stage transfer signal ST(N) of the GOA unit circuit of the latter N+1th stage;

the first pull-down module 400 comprises: a fortieth thin film transistor T40, and both a gate and a source of the fortieth thin film transistor T40 are electrically coupled to the first node Q(N), and a drain is electrically coupled to the source of a forty-first thin film transistor T41; a gate of the forty-first thin film transistor T41 is electrically coupled to an M+2th clock signal CK(M+2), and a source is electrically coupled to the drain of the fortieth thin film transistor T40, and a drain is electrically coupled to the second node D(N);

one end of the bootstrap capacitor 500 is electrically coupled to the first node Q(N), and the other end is electrically coupled to the second node D(N);

the pull-down holding module 600 comprises: an inverter F1, and an input end of the inverter F1 is electrically coupled to the first node Q(N), and an output end is electrically coupled to a gate of a thirty-second thin film transistor T32 and a gate of the forty-second thin film transistor T42; the thirty-second thin film transistor T32, and a gate of the thirty-second thin film transistor T32 is electrically coupled to the output end of the inverter F1, and a source is electrically coupled to the drain of the forty-first thin film transistor T41 and a drain is electrically coupled to a first negative voltage level VSS1; the forty-second thin film transistor T42, and a gate of the forty-second thin film transistor T42 is electrically coupled to the output end of the inverter F1, and the drain is electrically coupled to the first node Q(N), and a source is electrically coupled to a constant low voltage level DCL.

Figure 5:
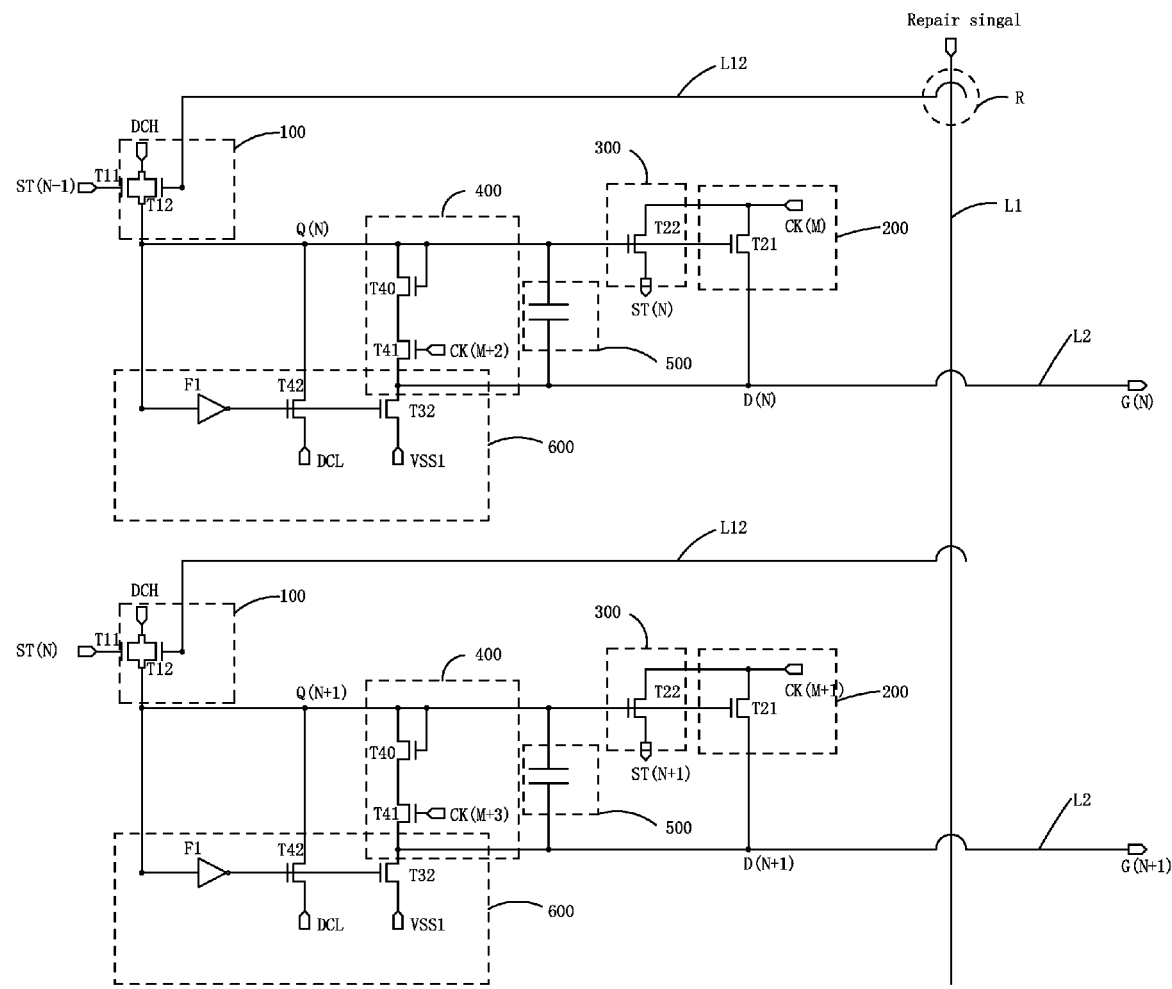
FIG. 5 is a circuit diagram of the second embodiment according to the GOA circuit repair method of the present invention before repair.
Figure 6:
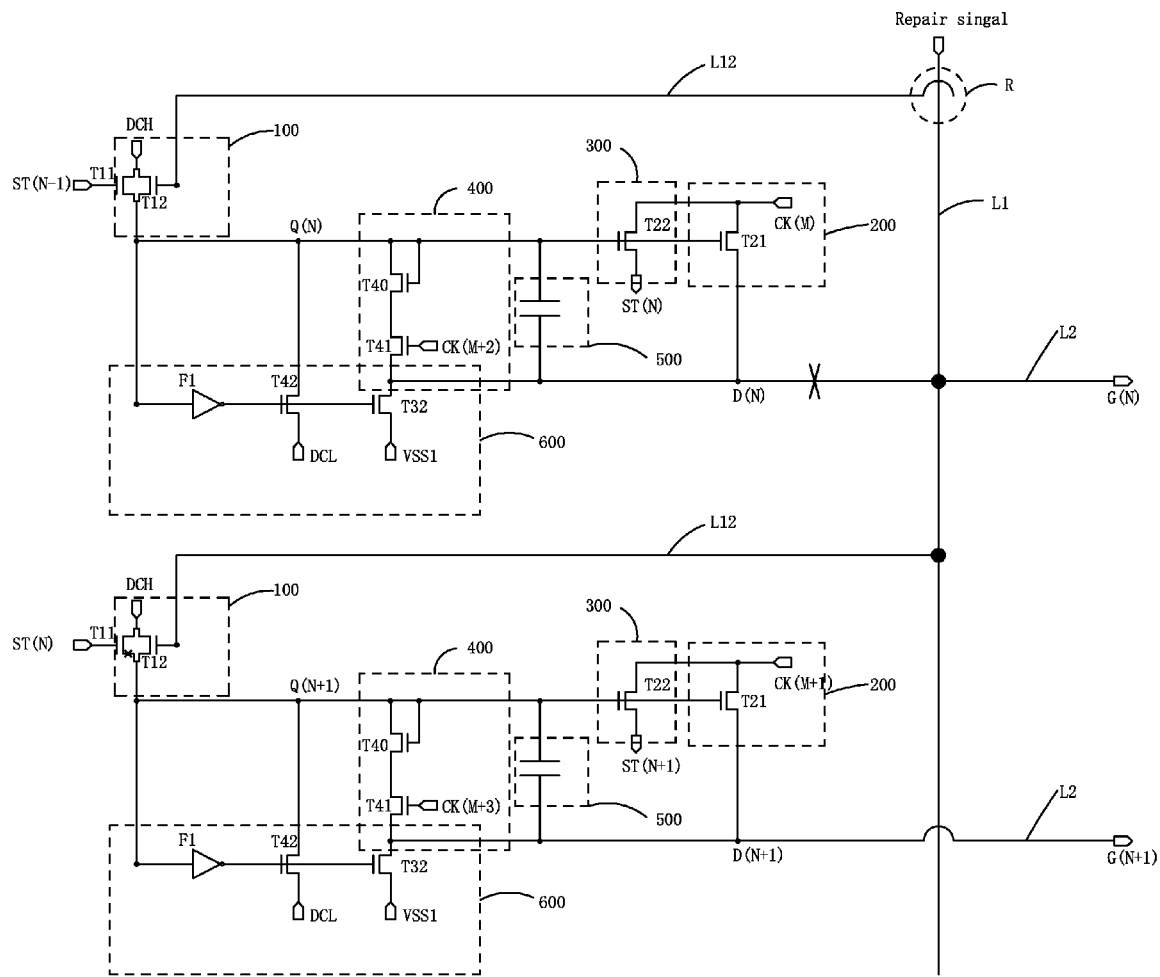
FIG. 6 is a circuit diagram of the second embodiment according to the GOA circuit repair method of the present invention after repair.

Please refer to FIG. 5, FIG. 6 in combination with FIG. 2, FIG. 3 and FIG. 9 showing the second embodiment of the GOA circuit repair method according to the present invention. The difference between the second embodiment and the first embodiment is that in the GOA unit circuit of Nth stage, the pull-up controlling module 100 additionally comprises a twelfth thin film transistor T12 coupled to the eleventh thin film transistor T11 in parallel. Specifically, a gate of the eleventh thin film transistor T11 receives a scan control signal ST(N−1) of the GOA unit circuit of the former N−1th stage, and a source is electrically coupled to a constant high voltage level DCH, and a drain is electrically coupled to a first node Q(N); a gate of the twelfth thin film transistor T12 is electrically coupled to a gate lead L12, and a source is electrically coupled to the constant high voltage level DCH, and a drain is electrically coupled to the first node Q(N).

Correspondingly, performing detection to the GOA circuit, and the two GOA unit circuits of the Nth stage, the N+1th stage are took to be one set, and as that the GOA unit circuit of the Nth stage is in normal work is detected, the gate lead L12 of the twelfth thin film transistor T12 and the repair signal line L1 in the GOA unit circuit of the Nth stage are insulation overlapping, and the scan signal output line L2 and the repair signal line L1 in the GOA unit circuit of the Nth stage are insulation overlapping; the gate lead L11 of the twelfth thin film transistor T12 and the repair signal line L1 in the GOA unit circuit of the N+1th stage are insulation overlapping, and the scan signal output line L2 and the repair signal line L1 in the GOA unit circuit of the N+1th stage are insulation overlapping.

As that the GOA unit circuit of the Nth stage is broken is detected, cutting the connection between the scan signal output line L2 and the pull-up module 200 in the GOA unit circuit of the Nth stage, and the connection between the drain of the eleventh thin film transistor T11 and the first node Q(N+1) in the GOA unit circuit of the N+1th stage by laser (a cross is used to indicate in FIG. 6), and conducting the scan signal output line L2 and the repair signal line L1 in the GOA unit circuit of the Nth stage, and the gate lead L12 of the twelfth thin film transistor T12 and the repair signal line L1 in the GOA unit circuit of the N+1th stage by laser welding (a filled circle is used to indicate in FIG. 6), and thus, the repair signal is received by the GOA unit circuits of the Nth stage, the N+1th stage respectively to be an output signal of the GOA unit circuit of the Nth stage, and the scan control signal of the GOA unit circuit of the N+1th stage to accomplish the repair to the GOA unit circuit of the Nth stage and to make the GOA unit circuits of the Nth stage, the N+1th stage remain the normal function.

The reset is the same as the first embodiment. The repeated description is omitted here.

Figure 7:
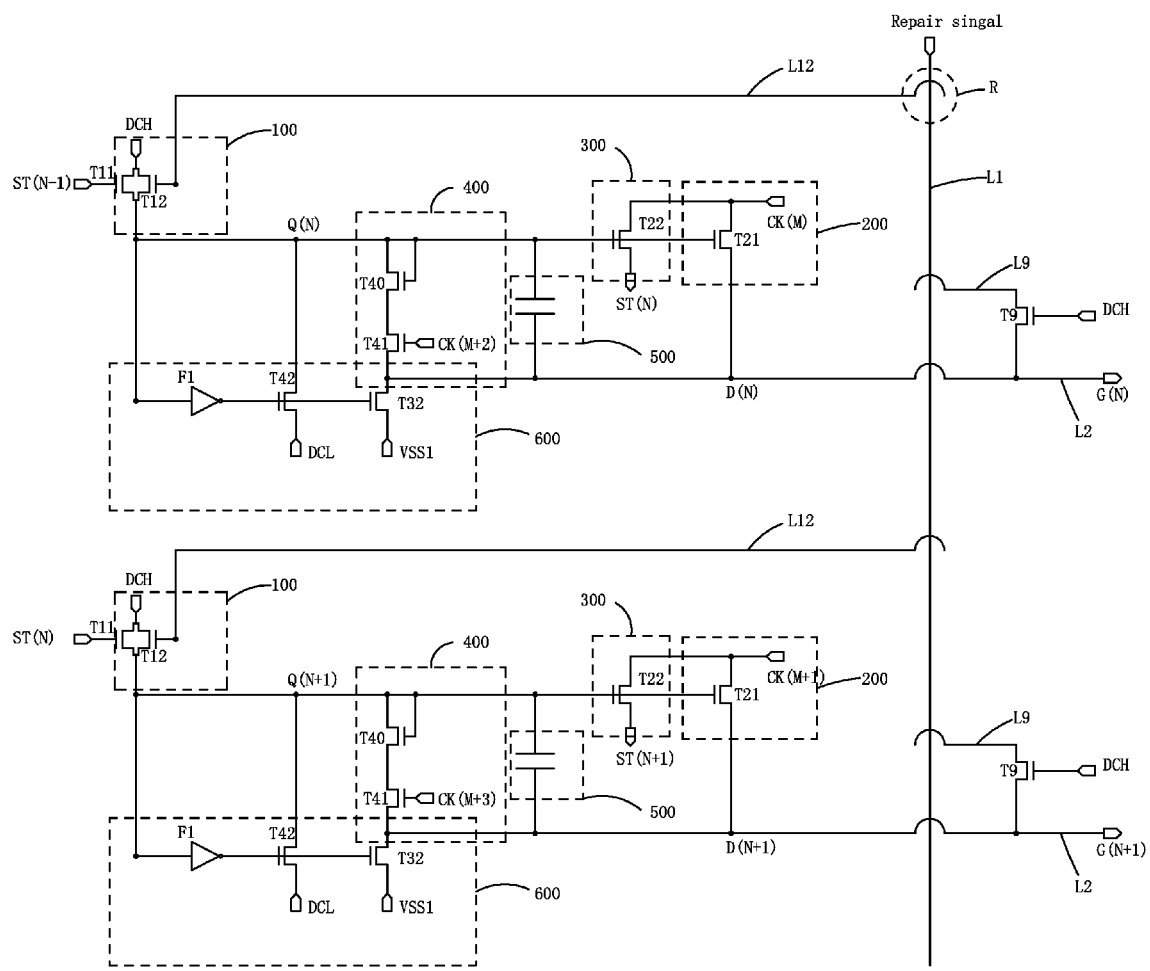
FIG. 7 is a circuit diagram of the third embodiment according to the GOA circuit repair method of the present invention before repair.
Figure 8:
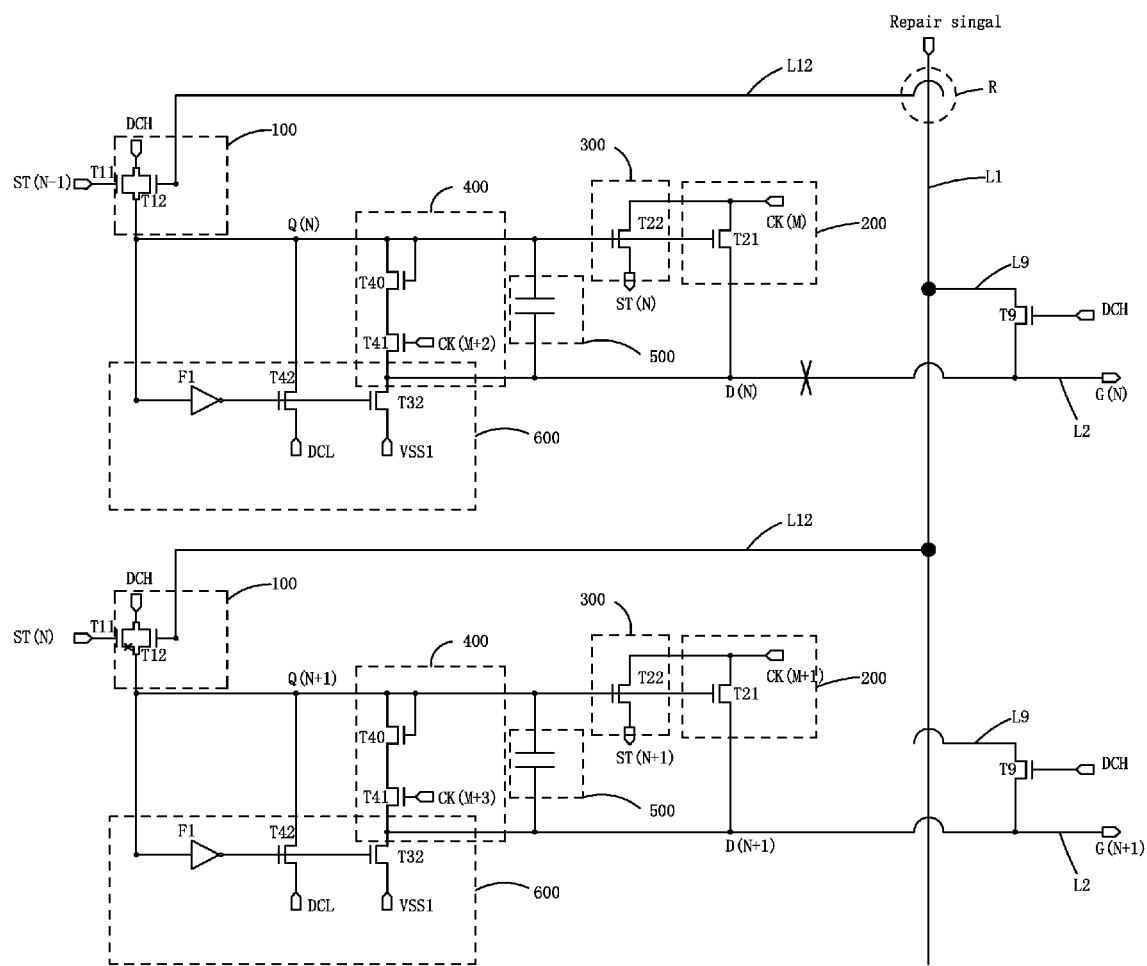
FIG. 8 is a circuit diagram of the third embodiment according to the GOA circuit repair method of the present invention after repair.

Please refer to FIG. 7, FIG. 8 in combination with FIG. 2, FIG. 3 and FIG. 9 showing the third embodiment of the GOA circuit repair method according to the present invention. Comparing the third embodiment with the second embodiment, the GOA unit circuit of Nth stage additionally comprises a ninth thin film transistor T9, and a gate of the ninth thin film transistor T9 is electrically coupled to the constant high voltage level DCH, and a drain is electrically coupled to the scan signal output line L2, and a source is electrically coupled to a source lead L9.

Performing detection to the GOA circuit, and the two GOA unit circuits of the Nth stage, the N+1th stage are took to be one set, and as that the GOA unit circuit of the Nth stage is in normal work is detected, beside as being similar to the second embodiment that the gate lead L12 of the twelfth thin film transistor T12 and the repair signal line L1 in the GOA unit circuit of the Nth stage are insulation overlapping, and the scan signal output line L2 and the repair signal line L1 in the GOA unit circuit of the Nth stage are insulation overlapping, and the gate lead L11 of the twelfth thin film transistor T12 and the repair signal line L1 in the GOA unit circuit of the N+1th stage are insulation overlapping, and the scan signal output line L2 and the repair signal line L1 in the GOA unit circuit of the N+1th stage are insulation overlapping, the source lead L9 of the ninth thin film transistor T9 and the repair signal line L1 in the GOA unit circuit of the Nth stage are insulation overlapping, and the source lead L9 of the ninth thin film transistor T9 and the repair signal line L1 in the GOA unit circuit of the N+1th stage are insulation overlapping.

As that the GOA unit circuit of the Nth stage is broken is detected, in the second embodiment, it is directly welding connecting the scan signal output line L2 and the repair signal line L1 in the GOA unit circuit of the Nth stage by laser welding to conduct the two but in the third embodiment, it is connecting the source lead L9 of the ninth thin film transistor T9 and the repair signal line L1 in the GOA unit circuit of the Nth stage by laser welding to conduct the scan signal output line L2 with the repair signal line L1 via the ninth thin film transistor T9. The repair signal is employed to be an output signal of the GOA unit circuit of the Nth stage and outputted via the ninth thin film transistor T9.

The reset is the same as the second embodiment. The repeated description is omitted here.

Figure 10:
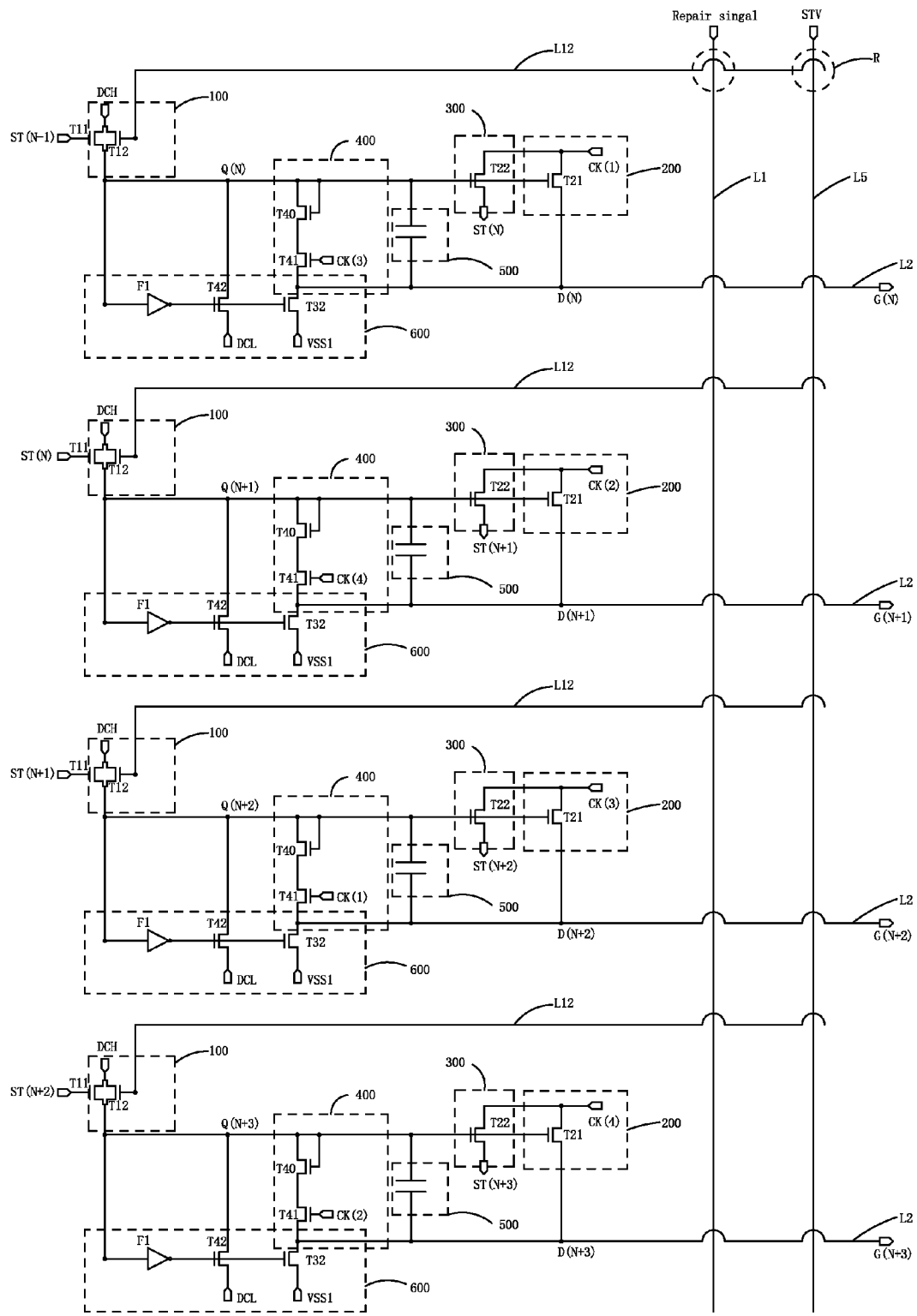
FIG. 10 is a circuit diagram of the fourth embodiment according to the GOA circuit repair method of the present invention before repair.
Figure 11:
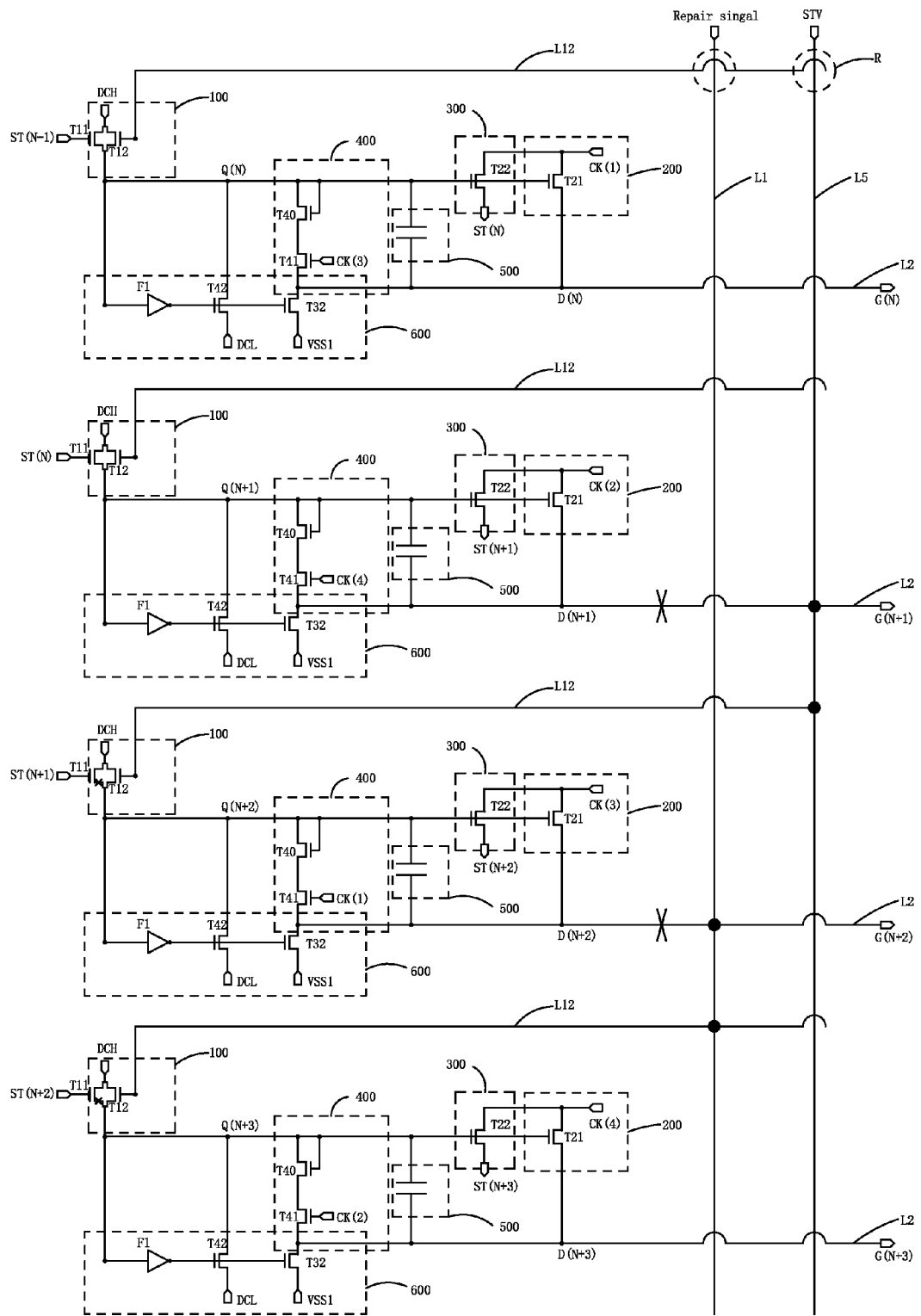
FIG. 11 is a circuit diagram of the fourth embodiment according to the GOA circuit repair method of the present invention after repair.
Figure 12:
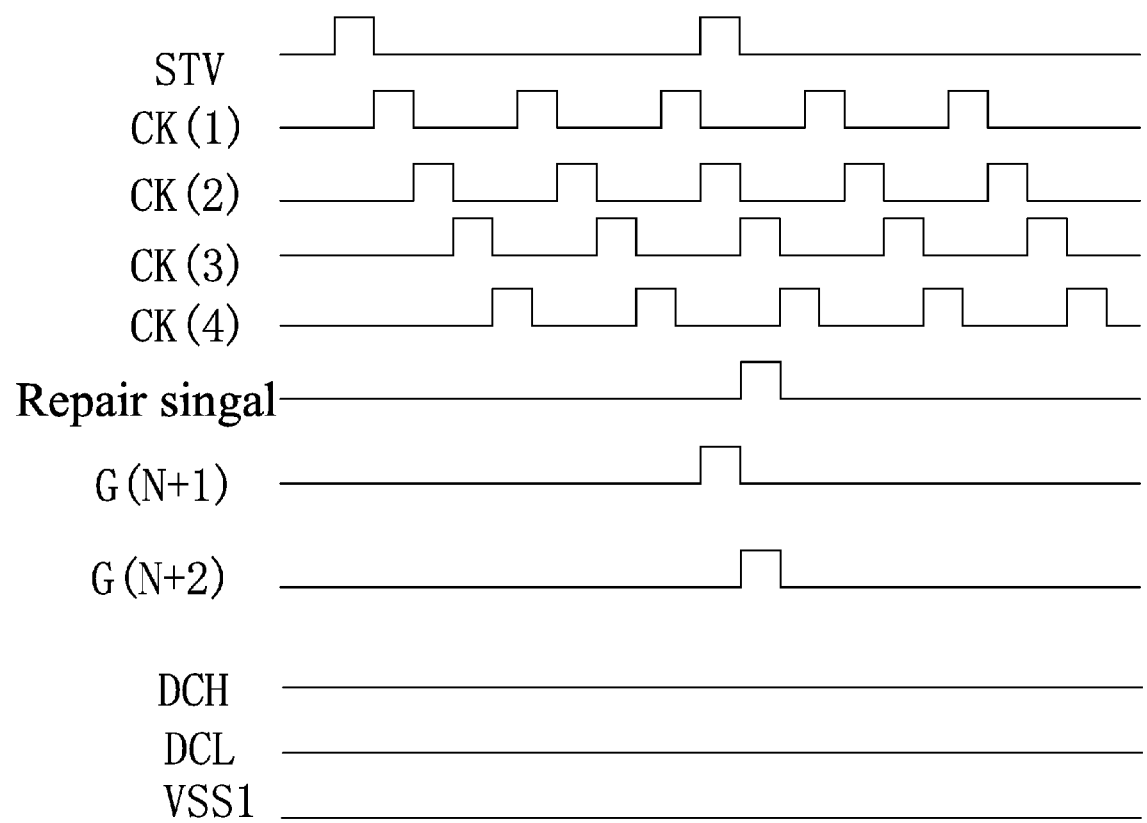
FIG. 12 is a sequence diagram corresponding to the fourth embodiment according to the GOA circuit repair method of the present invention.

Please refer to FIG. 10, FIG. 11, FIG. 12 in combination with FIG. 2, FIG. 3 showing the fourth embodiment of the GOA circuit repair method according to the present invention. All of the first, second, third embodiments utilize the repair signal line L1 to repair the single GOA unit circuit of the Nth stage. In the fourth embodiment, the GOA unit circuits of two stages can be repairs at the same time:

first providing a plurality of GOA unit circuit which are cascade connected, a repair signal, a repair signal line L1 electrically coupled to the repair signal, a start signal STV and a start signal line L5 electrically coupled to the start signal STV;

wherein the GOA unit circuit of every stage comprises a pull-up controlling module 100, a pull-up module 200, a transmission module 300, a first pull-down module 400, a bootstrap capacitor 500 and a pull-down holding module 600;

N is set to be a positive integer and in the GOA unit circuit of Nth stage, the pull-up controlling module 100 comprises an eleventh thin film transistor T11 and a twelfth thin film transistor T12 coupled in parallel, and a gate of the eleventh thin film transistor T11 receives a scan control signal ST(N−1) of the GOA unit circuit of the former N−1th stage, and a source is electrically coupled to a constant high voltage level DCH, and a drain is electrically coupled to a first node Q(N), and a gate of the twelfth thin film transistor T12 is electrically coupled to a gate lead L12, and a source is electrically coupled to the constant high voltage level DCH, and a drain is electrically coupled to the first node Q(N); the transmission module 300 outputs a scan control signal ST(N) of the GOA unit circuit of the latter N−1th stage; the pull-up module 200 outputs a scan signal G(N); the scan signal G(N) is outputted via the scan signal output line L2.

Then, performing detection to the GOA circuit, and the four GOA unit circuits of the Nth stage, the N+1th stage, the N+2th stage and the N+3th stage are took to be one set, and as that the GOA unit circuits of the N+1th stage and the N+2th stage are in normal work is detected, the gate leads L12 of the respective twelfth thin film transistors T12 of the Nth stage, the N+1th stage, the N+2th stage and the N+3th stage are respectively insulation overlapping with the repair signal lines L1 and the start signal lines L5, and the scan signal output line L2 is respectively insulation overlapping with the repair signal line L1 and the start signal line L5.

As that the GOA unit circuits of the N+1th stage and the N+2th stage are broken is detected, cutting the connection between the scan signal output line L2 and the pull-up module 200 in the GOA unit circuit of the N+1th stage, the connection between the drain of the eleventh thin film transistor T11 and the first node Q(N+2) in the GOA unit circuit of the N+2th stage, the connection between the scan signal output line L2 and the pull-up module 200 in the GOA unit circuit of the N+2th stage, and the connection between the drain of the eleventh thin film transistor T11 and the first node Q(N+3) in the GOA unit circuit of the N+3th stage by laser (a cross is used to indicate in FIG. 11), and conducting the scan signal output line L2 and the start signal line L5 in the GOA unit circuit of the N+1th stage, and the gate lead L12 of the twelfth thin film transistor T12 and the start signal line L5 in the GOA unit circuit of the N+2th stage, the scan signal output line L2 and the repair signal line L1 in the GOA unit circuit of the N+2th stage, and the gate lead L12 of the twelfth thin film transistor T12 and the repair signal line L1 in the GOA unit circuit of the N+3th stage by laser welding (a filled circle is used to indicate in FIG. 11), and thus, the start signal STV is received by the GOA unit circuits of the N+1th stage and the N+2th stage, respectively to be an output signal of the GOA unit circuit of the N+1th stage, and the scan control signal of the GOA unit circuit of the N+2th stage, and the repair signal is received by the GOA unit circuits of the N+2th stage and the N+3th stage, respectively to be an output signal of the GOA unit circuit of the N+2th stage, and the scan control signal of the GOA unit circuit of the N+3th stage to accomplish the repair to the GOA unit circuits of the N+1th stage and the N+2th stage and to make the GOA circuit remain the normal function.

As shown in FIG. 10, FIG. 11, the specific structure of the pull-up module 200, the transmission module 300, the first pull-down module 400, the bootstrap capacitor 500 and the pull-down holding module 600 in the GOA unit circuit of the Nth stage is the same as that in the first embodiment. The repeated description is omitted here.

FIG. 12 is a sequence diagram corresponding to the fourth embodiment according to the GOA circuit repair method of the present invention. The clock signal CK(M) comprises four clock signals: a first clock signal CK(1), a second clock signal CK(2), a third clock signal CK(3) and a fourth clock signal CK(4); as the clock signal CK(M) is the third clock signal (CK(3)), the M+2th clock signal CK(M+2) is the first clock signal CK(1), and as the clock signal CK(M) is the fourth clock signal CK(4), the M+2th clock signal CK(M+2) is the second clock signal CK(2); STV is the circuit start signal having two pulses, and one pulse is employed for starting the circuit, and one pulse is employed to generate the output signal G(N−1) of the GOA unit circuit of the N+1th stage for repairing the GOA unit circuit of the N+1th stage; the repair signal generates the output signal G(N+2) of the GOA unit circuit of the N+2th stage to repair the GOA unit circuit of the N+2th stage.

Significantly, as shown in FIG. 10, FIG. 11, as the sources of the respective twenty-first thin film transistors T21 in the respective pull-up modules 200 of the Nth stage, the N+1th stage, the N+2th stage and the N+3th stage are respectively coupled to the first clock signal CK(1), the second clock signal CK(2), the third clock signal CK(3) and the fourth clock signal CK(4), the start signal STV repairs the GOA unit circuit of the N+1th stage corresponding to the second clock signal CK(2).

In conclusion, in the GOA circuit repair method provided by the present invention, the repair signal is received by the GOA unit circuits of the Nth stage and the N+1th stage via the repair signal line respectively to be the output signal of the GOA unit circuit of the Nth stage, and the scan control signal of the GOA unit circuit of the N+1th stage to achieve the repair to the GOA unit circuit of the Nth stage; or the start signal is received by the GOA unit circuits of the N+1th stage and the N+2th stage via the start signal line respectively to be the output signal of the GOA unit circuit of the N+1th stage, and the scan control signal of the GOA unit circuit of the N+2th stage to achieve the repair to the GOA unit circuit of the N+1th stage, and meanwhile, the repair signal is received by the GOA unit circuits of the N+2th stage and the N+3th stage via the repair signal line respectively to be the output signal of the GOA unit circuit of the N+2th stage, and the scan control signal of the GOA unit circuit of the N+3th stage to achieve the repair to the GOA unit circuit of the N+2th stage, it is capable of reducing the repair difficulty of the GOA circuit to raise the yield of the GOA production and to decrease the production cost.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A GOA circuit repair method,
    first providing a plurality of GOA unit circuit which are cascade connected, a repair signal and a repair signal line electrically coupled to the repair signal;
    wherein the GOA unit circuit of every stage comprises a pull-up controlling module, a pull-up module, a transmission module, a first pull-down module, a bootstrap capacitor and a pull-down holding module;
    N is set to be a positive integer and in the GOA unit circuit of Nth stage, the pull-up controlling module comprises an eleventh thin film transistor, and a gate of the eleventh thin film transistor receives a scan control signal of the GOA unit circuit of the former N−1th stage, and a source is electrically coupled to a constant high voltage level, and a drain is electrically coupled to a first node; the transmission module outputs a scan control signal of the GOA unit circuit of the latter N−1th stage; the pull-up module outputs a scan signal; the gate of the eleventh thin film transistor is electrically coupled to a gate lead, and the scan signal is outputted via a scan signal output line;
    then, performing detection to the GOA circuit, and the two GOA unit circuits of the Nth stage, the N+1th stage are took to be one set, and as that the GOA unit circuit of the Nth stage is in normal work is detected, the gate lead of the eleventh thin film transistor and the repair signal line in the GOA unit circuit of the Nth stage are insulation overlapping, and the scan signal output line and the repair signal line in the GOA unit circuit of the Nth stage are insulation overlapping; the gate lead of the eleventh thin film transistor and the repair signal line in the GOA unit circuit of the N+1th stage are insulation overlapping, and the scan signal output line and the repair signal line in the GOA unit circuit of the N+1th stage are insulation overlapping;
    as that the GOA unit circuit of the Nth stage is broken is detected, cutting the connection between the scan signal output line and the pull-up module in the GOA unit circuit of the Nth stage, and the connection between the gate of the eleventh thin film transistor in the GOA unit circuit of the N+1th stage and the scan control signal of the GOA unit circuit of the N+1th stage by laser, and conducting the scan signal output line and the repair signal line in the GOA unit circuit of the Nth stage, and the gate lead of the eleventh thin film transistor and the repair signal line in the GOA unit circuit of the N+1th stage by laser welding, and thus, the repair signal is received by the GOA unit circuits of the Nth stage, the N+1th stage respectively to be an output signal of the GOA unit circuit of the Nth stage, and the scan control signal of the GOA unit circuit of the N+1th stage.

2. The GOA circuit repair method according to claim 1, wherein the insulation overlapping is achieved by positioning an insulation layer between the first, second metal layers.

3. The GOA circuit repair method according to claim 1, wherein in the GOA unit circuit of the Nth stage, the pull-up module comprises: a twenty-first thin film transistor, and a gate of the twenty-first thin film transistor is electrically coupled to the first node, and a source is electrically coupled to an Mth clock signal, and a drain is electrically coupled to a second node and outputs the scan signal;
    the transmission module comprises: a twenty-second thin film transistor, and a gate of the twenty-second thin film transistor is electrically coupled to the first node, and a source is electrically coupled to the Mth clock signal, and a drain is electrically coupled to the scan control signal of the GOA unit circuit of the N+1th stage;
    the first pull-down module comprises: a fortieth thin film transistor, and both a gate and a source of the fortieth thin film transistor are electrically coupled to the first node, and a drain is electrically coupled to the source of a forty-first thin film transistor; a gate of the forty-first thin film transistor is electrically coupled to an M+2th clock signal, and a source is electrically coupled to the drain of the fortieth thin film transistor, and a drain is electrically coupled to the second node;
    one end of the bootstrap capacitor is electrically coupled to the first node, and the other end is electrically coupled to the second node;
    the pull-down holding module comprises: an inverter, and an input end of the inverter is electrically coupled to the first node, and an output end is electrically coupled to a gate of a thirty-second thin film transistor and a gate of the forty-second thin film transistor; the thirty-second thin film transistor, and a gate of the thirty-second thin film transistor is electrically coupled to the output end of the inverter, and a source is electrically coupled to the drain of the forty-first thin film transistor, and a drain is electrically coupled to a first negative voltage level; the forty-second thin film transistor, and a gate of the forty-second thin film transistor is electrically coupled to the output end of the inverter, and the drain is electrically coupled to the first node, and a source is electrically coupled to a constant low voltage level;
    the clock signal comprises four clock signals: a first clock signal, a second clock signal, a third clock signal and a fourth clock signal; as the clock signal is the third clock signal, the M+2th clock signal is the first clock signal, and as the clock signal is the fourth clock signal, the M+2th clock signal is the second clock signal.

4. A GOA circuit repair method,
    first providing a plurality of GOA unit circuit which are cascade connected, a repair signal and a repair signal line electrically coupled to the repair signal;
    wherein the GOA unit circuit of every stage comprises a pull-up controlling module, a pull-up module, a transmission module, a first pull-down module, a bootstrap capacitor and a pull-down holding module;
    N is set to be a positive integer and in the GOA unit circuit of Nth stage, the pull-up controlling module comprises an eleventh thin film transistor and a twelfth thin film transistor coupled in parallel, and a gate of the eleventh thin film transistor receives a scan control signal of the GOA unit circuit of the former N−1th stage, and a source is electrically coupled to a constant high voltage level, and a drain is electrically coupled to a first node, and a gate of the twelfth thin film transistor is electrically coupled to a gate lead, and a source is electrically coupled to the constant high voltage level, and a drain is electrically coupled to the first node; the transmission module outputs a scan control signal of the GOA unit circuit of the latter N+1th stage; the pull-up module outputs a scan signal; the scan signal is outputted via a scan signal output line;

then, performing detection to the GOA circuit, and the two GOA unit circuits of the Nth stage, the N+1th stage are took to be one set, and as that the GOA unit circuit of the Nth stage is in normal work is detected, the gate lead of the twelfth thin film transistor and the repair signal line in the GOA unit circuit of the Nth stage are insulation overlapping, and the scan signal output line and the repair signal line in the GOA unit circuit of the Nth stage are insulation overlapping; the gate lead of the twelfth thin film transistor and the repair signal line in the GOA unit circuit of the N+1th stage are insulation overlapping, and the scan signal output line and the repair signal line in the GOA unit circuit of the N+1th stage are insulation overlapping;

as that the GOA unit circuit of the Nth stage is broken is detected, cutting the connection between the scan signal output line and the pull-up module in the GOA unit circuit of the Nth stage, and the connection between the drain of the eleventh thin film transistor and the first node in the GOA unit circuit of the N+1th stage by laser, and conducting the scan signal output line and the repair signal line in the GOA unit circuit of the Nth stage, and the gate lead of the twelfth thin film transistor and the repair signal line in the GOA unit circuit of the N+1th stage by laser welding, and thus, the repair signal is received by the GOA unit circuits of the Nth stage, the N+1th stage respectively to be an output signal of the GOA unit circuit of the Nth stage, and the scan control signal of the GOA unit circuit of the N+1th stage.

5. The GOA circuit repair method according to claim 4, wherein the GOA unit circuit of the Nth stage further comprises a ninth thin film transistor, and a gate of the ninth thin film transistor is electrically coupled to the constant high voltage level, and a drain is electrically coupled to the scan signal output line, and a source is electrically coupled to a source lead;

performing detection to the GOA circuit, and the two GOA unit circuits of the Nth stage, the N+1th stage are took to be one set, and as that the GOA unit circuit of the Nth stage is in normal work is detected, the source lead of the ninth thin film transistor and the repair signal line in the GOA unit circuit of the Nth stage are insulation overlapping, and the source lead of the ninth thin film transistor and the repair signal line in the GOA unit circuit of the N+1th stage are insulation overlapping;

as that the GOA unit circuit of the Nth stage is broken is detected, connecting the source lead of the ninth thin film transistor and the repair signal line in the GOA unit circuit of the Nth stage by laser welding, and thus, conducting the scan signal output line and the repair signal line.

6. The GOA circuit repair method according to claim 4, wherein the insulation overlapping is achieved by positioning an insulation layer between the first, second metal layers.

7. The GOA circuit repair method according to claim 5, wherein the insulation overlapping is achieved by positioning an insulation layer between the first, second metal layers.

8. The GOA circuit repair method according to claim 4, wherein in the GOA unit circuit of the Nth stage, the pull-up module comprises: a twenty-first thin film transistor, and a gate of the twenty-first thin film transistor is electrically coupled to the first node, and a source is electrically coupled to an Mth clock signal, and a drain is electrically coupled to a second node and outputs the scan signal;

the transmission module comprises: a twenty-second thin film transistor, and a gate of the twenty-second thin film transistor is electrically coupled to the first node, and a source is electrically coupled to the Mth clock signal, and a drain is electrically coupled to the scan control signal of the GOA unit circuit of the N+1th stage;

the first pull-down module comprises: a fortieth thin film transistor, and both a gate and a source of the fortieth thin film transistor are electrically coupled to the first node, and a drain is electrically coupled to the source of a forty-first thin film transistor; a gate of the forty-first thin film transistor is electrically coupled to an M+2th clock signal, and a source is electrically coupled to the drain of the fortieth thin film transistor, and a drain is electrically coupled to the second node;

one end of the bootstrap capacitor is electrically coupled to the first node, and the other end is electrically coupled to the second node;

the pull-down holding module comprises: an inverter, and an input end of the inverter is electrically coupled to the first node, and an output end is electrically coupled to a gate of a thirty-second thin film transistor and a gate of the forty-second thin film transistor; the thirty-second thin film transistor, and a gate of the thirty-second thin film transistor is electrically coupled to the output end of the inverter, and a source is electrically coupled to the drain of the forty-first thin film transistor, and a drain is electrically coupled to a first negative voltage level; the forty-second thin film transistor, and a gate of the forty-second thin film transistor is electrically coupled to the output end of the inverter, and the drain is electrically coupled to the first node, and a source is electrically coupled to a constant low voltage level;

the clock signal comprises four clock signals: a first clock signal, a second clock signal, a third clock signal and a fourth clock signal; as the clock signal is the third clock signal, the M+2th clock signal is the first clock signal, and as the clock signal is the fourth clock signal, the M+2th clock signal is the second clock signal.

9. The GOA circuit repair method according to claim 5, wherein in the GOA unit circuit of the Nth stage, the pull-up module comprises: a twenty-first thin film transistor, and a gate of the twenty-first thin film transistor is electrically coupled to the first node, and a source is electrically coupled to an Mth clock signal, and a drain is electrically coupled to a second node and outputs the scan signal;

the transmission module comprises: a twenty-second thin film transistor, and a gate of the twenty-second thin film transistor is electrically coupled to the first node, and a source is electrically coupled to the Mth clock signal, and a drain is electrically coupled to the scan control signal of the GOA unit circuit of the N+1th stage;

the first pull-down module comprises: a fortieth thin film transistor, and both a gate and a source of the fortieth thin film transistor are electrically coupled to the first node, and a drain is electrically coupled to the source of a forty-first thin film transistor; a gate of the forty-first thin film transistor is electrically coupled to an M+2th clock signal, and a source is electrically coupled to the drain of the fortieth thin film transistor, and a drain is electrically coupled to the second node;

one end of the bootstrap capacitor is electrically coupled to the first node, and the other end is electrically coupled to the second node;

the pull-down holding module comprises: an inverter, and an input end of the inverter is electrically coupled to the first node, and an output end is electrically coupled to a gate of a thirty-second thin film transistor and a gate of the forty-second thin film transistor; the thirty-second thin film transistor, and a gate of the thirty-second thin film transistor is electrically coupled to the output end of the inverter, and a source is electrically coupled to the drain of the forty-first thin film transistor, and a drain is electrically coupled to a first negative voltage level; the forty-second thin film transistor, and a gate of the forty-second thin film transistor is electrically coupled to the output end of the inverter, and the drain is electrically coupled to the first node, and a source is electrically coupled to a constant low voltage level;

the clock signal comprises four clock signals: a first clock signal, a second clock signal, a third clock signal and a fourth clock signal; as the clock signal is the third clock signal, the M+2th clock signal is the first clock signal, and as the clock signal is the fourth clock signal, the M+2th clock signal is the second clock signal.

10. A GOA circuit repair method, first providing a plurality of GOA unit circuit which are cascade connected, a repair signal, a repair signal line electrically coupled to the repair signal, a start signal and a start signal line electrically coupled to the start signal;

wherein the GOA unit circuit of every stage comprises a pull-up controlling module, a pull-up module, a transmission module, a first pull-down module, a bootstrap capacitor and a pull-down holding module;

N is set to be a positive integer and in the GOA unit circuit of Nth stage, the pull-up controlling module comprises an eleventh thin film transistor and a twelfth thin film transistor coupled in parallel, and a gate of the eleventh thin film transistor receives a scan control signal of the GOA unit circuit of the former N−1th stage, and a source is electrically coupled to a constant high voltage level, and a drain is electrically coupled to a first node, and a gate of the twelfth thin film transistor is electrically coupled to a gate lead, and a source is electrically coupled to the constant high voltage level, and a drain is electrically coupled to the first node; the transmission module outputs a scan control signal of the GOA unit circuit of the latter N+1th stage; the pull-up module outputs a scan signal; the scan signal is outputted via a scan signal output line;

then, performing detection to the GOA circuit, and the four GOA unit circuits of the Nth stage, the N+1th stage, the N+2th stage and the N+3th stage are took to be one set, and as that the GOA unit circuits of the N+1th stage and the N+2th stage are in normal work is detected, the gate leads of the respective twelfth thin film transistors of the Nth stage, the N+1th stage, the N+2th stage and the N+3th stage are respectively insulation overlapping with the repair signal lines and the start signal lines, and the scan signal output line is respectively insulation overlapping with the repair signal line and the start signal line;

as that the GOA unit circuits of the N+1th stage and the N+2th stage are broken is detected, cutting the connection between the scan signal output line and the pull-up module in the GOA unit circuit of the N+1th stage, the connection between the drain of the eleventh thin film transistor and the first node in the GOA unit circuit of the N+2th stage, the connection between the scan signal output line and the pull-up module in the GOA unit circuit of the N+2th stage, and the connection between the drain of the eleventh thin film transistor and the first node in the GOA unit circuit of the N+3th stage by laser, and conducting the scan signal output line and the start signal line in the GOA unit circuit of the N+1th stage, and the gate lead of the twelfth thin film transistor and the start signal line in the GOA unit circuit of the N+2th stage, the scan signal output line and the repair signal line in the GOA unit circuit of the N+2th stage, and the gate lead of the twelfth thin film transistor and the repair signal line in the GOA unit circuit of the N+3th stage by laser welding, and thus, the start signal is received by the GOA unit circuits of the N+1th stage and the N+2th stage, respectively to be an output signal of the GOA unit circuit of the N+1th stage, and the scan control signal of the GOA unit circuit of the N+2th stage, and the repair signal is received by the GOA unit circuits of the N+2th stage and the N+3th stage, respectively to be an output signal of the GOA unit circuit of the N+2th stage, and the scan control signal of the GOA unit circuit of the N+3th stage.

11. The GOA circuit repair method according to claim 10, wherein the insulation overlapping is achieved by positioning an insulation layer between the first, second metal layers.

12. The GOA circuit repair method according to claim 10, wherein in the GOA unit circuit of the Nth stage, the pull-up module comprises: a twenty-first thin film transistor, and a gate of the twenty-first thin film transistor is electrically coupled to the first node, and a source is electrically coupled to an Mth clock signal, and a drain is electrically coupled to a second node and outputs the scan signal;

the transmission module comprises: a twenty-second thin film transistor, and a gate of the twenty-second thin film transistor is electrically coupled to the first node, and a source is electrically coupled to the Mth clock signal, and a drain is electrically coupled to the scan control signal of the GOA unit circuit of the N+1th stage;

the first pull-down module comprises: a fortieth thin film transistor, and both a gate and a source of the fortieth thin film transistor are electrically coupled to the first node, and a drain is electrically coupled to the source of a forty-first thin film transistor; a gate of the forty-first thin film transistor is electrically coupled to an M+2th clock signal, and a source is electrically coupled to the drain of the fortieth thin film transistor, and a drain is electrically coupled to the second node;

one end of the bootstrap capacitor is electrically coupled to the first node, and the other end is electrically coupled to the second node;

the pull-down holding module comprises: an inverter, and an input end of the inverter is electrically coupled to the first node, and an output end is electrically coupled to a gate of a thirty-second thin film transistor and a gate of the forty-second thin film transistor; the thirty-second thin film transistor, and a gate of the thirty-second thin film transistor is electrically coupled to the output end of the inverter, and a source is electrically coupled to the drain of the forty-first thin film transistor, and a drain is electrically coupled to a first negative voltage level; the forty-second thin film transistor, and a gate of the forty-second thin film transistor is electrically coupled to the output end of the inverter, and the drain is electrically coupled to the first node, and a source is electrically coupled to a constant low voltage level;

the clock signal comprises four clock signals: a first clock signal, a second clock signal, a third clock signal and a fourth clock signal; as the clock signal is the third clock signal, the M+2th clock signal is the first clock signal, and as the clock signal is the fourth clock signal, the M+2th clock signal is the second clock signal.

* * * * *